United States Patent
Chiu et al.

(10) Patent No.: US 8,896,089 B2
(45) Date of Patent: Nov. 25, 2014

(54) INTERPOSERS FOR SEMICONDUCTOR DEVICES AND METHODS OF MANUFACTURE THEREOF

(75) Inventors: Tzu-Wei Chiu, Hsin-Chu (TW); Tzu-Yu Wang, Taipei (TW); Wei-Cheng Wu, Hsin-Chu (TW); Chun-Yi Liu, Hsin-Chu (TW); Hsien-Pin Hu, Zhubei (TW); Shang-Yun Hou, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 210 days.

(21) Appl. No.: 13/292,792

(22) Filed: Nov. 9, 2011

(65) Prior Publication Data

US 2013/0113070 A1      May 9, 2013

(51) Int. Cl.
| | |
|---|---|
| *H01L 23/52* | (2006.01) |
| *H01L 21/82* | (2006.01) |
| *H01L 23/498* | (2006.01) |
| *H01L 23/538* | (2006.01) |
| H01L 23/00 | (2006.01) |
| H01L 23/525 | (2006.01) |
| H01L 23/48 | (2006.01) |
| H01L 23/31 | (2006.01) |

(52) U.S. Cl.
CPC ......... *H01L 23/49827* (2013.01); *H01L 24/81* (2013.01); *H01L 2224/13124* (2013.01); *H01L 23/525* (2013.01); *H01L 2224/13184* (2013.01); *H01L 24/16* (2013.01); *H01L 2224/13147* (2013.01); *H01L 2224/16225* (2013.01); *H01L 23/5256* (2013.01); *H01L 2224/13169* (2013.01); *H01L 24/73* (2013.01); *H01L 2224/32225* (2013.01); *H01L 2224/13139* (2013.01); *H01L 2224/81192* (2013.01); *H01L 24/13* (2013.01); *H01L 23/481* (2013.01); *H01L 24/32* (2013.01); *H01L 23/3128* (2013.01); *H01L 23/5382* (2013.01); *H01L 2224/13144* (2013.01); *H01L 2224/73204* (2013.01); *H01L 2924/01322* (2013.01); *H01L 2924/15311* (2013.01); *H01L 2924/157* (2013.01); *H01L 2224/13155* (2013.01)
USPC ............... 257/529; 257/E23.149; 438/132

(58) Field of Classification Search
USPC .............. 257/209, 529, 530, 698, E23.147, 257/E23.149, E21.592; 438/131–132, 600, 438/467
See application file for complete search history.

(56) References Cited

U.S. PATENT DOCUMENTS

| | | | |
|---|---|---|---|
| 5,391,917 | A | 2/1995 | Gilmour et al. |
| 5,510,298 | A | 4/1996 | Redwine |
| 5,767,001 | A | 6/1998 | Bertagnolli et al. |
| 5,998,292 | A | 12/1999 | Black et al. |
| 6,033,939 | A * | 3/2000 | Agarwala et al. ............. 438/132 |
| 6,184,060 | B1 | 2/2001 | Siniaguine |
| 6,322,903 | B1 | 11/2001 | Siniaguine et al. |
| 6,448,168 | B1 | 9/2002 | Rao et al. |
| 6,465,892 | B1 | 10/2002 | Suga |
| 6,472,293 | B1 | 10/2002 | Suga |
| 6,538,333 | B2 | 3/2003 | Kong |

(Continued)

*Primary Examiner* — Daniel Luke
*Assistant Examiner* — Khaja Ahmad
(74) *Attorney, Agent, or Firm* — Slater & Matsil, LLP

(57) ABSTRACT

Interposers for semiconductor devices and methods of manufacture thereof are disclosed. In one embodiment, an interposer includes a substrate, a contact pad disposed on the substrate, and a first through-via in the substrate coupled to the contact pad. A first fuse is coupled to the first through-via. A second through-via in the substrate is coupled to the contact pad, and a second fuse is coupled to the second through-via.

20 Claims, 7 Drawing Sheets

(56) References Cited

U.S. PATENT DOCUMENTS

| | | |
|---|---|---|
| 6,599,778 B2 | 7/2003 | Pogge et al. |
| 6,639,303 B2 | 10/2003 | Siniaguine |
| 6,664,129 B2 | 12/2003 | Siniaguine |
| 6,693,361 B1 | 2/2004 | Siniaguine et al. |
| 6,740,582 B2 | 5/2004 | Siniaguine |
| 6,800,930 B2 | 10/2004 | Jackson et al. |
| 6,841,883 B1 | 1/2005 | Farnworth et al. |
| 6,882,030 B2 | 4/2005 | Siniaguine |
| 6,924,551 B2 | 8/2005 | Rumer et al. |
| 6,962,867 B2 | 11/2005 | Jackson et al. |
| 6,962,872 B2 | 11/2005 | Chudzik et al. |
| 7,030,481 B2 | 4/2006 | Chudzik et al. |
| 7,049,170 B2 | 5/2006 | Savastiouk et al. |
| 7,060,601 B2 | 6/2006 | Savastiouk et al. |
| 7,071,546 B2 | 7/2006 | Fey et al. |
| 7,111,149 B2 | 9/2006 | Eilert |
| 7,122,912 B2 | 10/2006 | Matsui |
| 7,157,787 B2 | 1/2007 | Kim et al. |
| 7,193,308 B2 | 3/2007 | Matsui |
| 7,262,495 B2 | 8/2007 | Chen et al. |
| 7,297,574 B2 | 11/2007 | Thomas et al. |
| 7,335,972 B2 | 2/2008 | Chanchani |
| 7,355,273 B2 | 4/2008 | Jackson et al. |
| 2002/0105092 A1* | 8/2002 | Coyle ............................. 257/778 |
| 2008/0182361 A1* | 7/2008 | Horton et al. ................. 438/109 |
| 2012/0267751 A1* | 10/2012 | Haba et al. .................... 257/499 |

* cited by examiner

INTERPOSERS FOR SEMICONDUCTOR DEVICES AND METHODS OF MANUFACTURE THEREOF

BACKGROUND

Semiconductor devices are used in a variety of electronic applications, such as personal computers, cell phones, digital cameras, and other electronic equipment, as examples. The semiconductor industry continues to improve the integration density of various electronic components (e.g., transistors, diodes, resistors, capacitors, etc.) by continual reductions in minimum feature sizes of integrated circuits (ICs), which allow more components to be integrated into a given area. These smaller electronic components also require smaller packages that utilize less area than packages of the past, in some applications.

One type of smaller packaging that has been developed is three-dimensional (3D) ICs, in which two die or ICs are bonded together and electrical connections are formed between the die and contact pads on an interposer. Some 3DICs utilize through-silicon vias to make connections from one side to another side of the interposer.

Fuses are devices that are sometimes formed on semiconductor devices that may be programmed using a laser, by directing a laser beam at the fuse from the top or bottom of the semiconductor device. Fuses may be used to alter ICs by connecting or disconnecting redundant circuits or memory cells, to repair the ICs or increase the number of usable ICs on a wafer, for example.

BRIEF DESCRIPTION OF THE DRAWINGS

For a more complete understanding of the present disclosure, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

The making and using of the embodiments of the present disclosure are discussed in detail below. It should be appreciated, however, that the present disclosure provides many applicable inventive concepts that can be embodied in a wide variety of specific contexts. The specific embodiments discussed are merely illustrative of specific ways to make and use the disclosure, and do not limit the scope of the disclosure.

Embodiments of the present disclosure are related to packages for semiconductor devices that utilize an interposer as a component, such as 3DICs. Structures and methods of forming interposers that include a plurality of fuses coupled to a single contact or bump of the interposers will be described herein.

Figure 1:
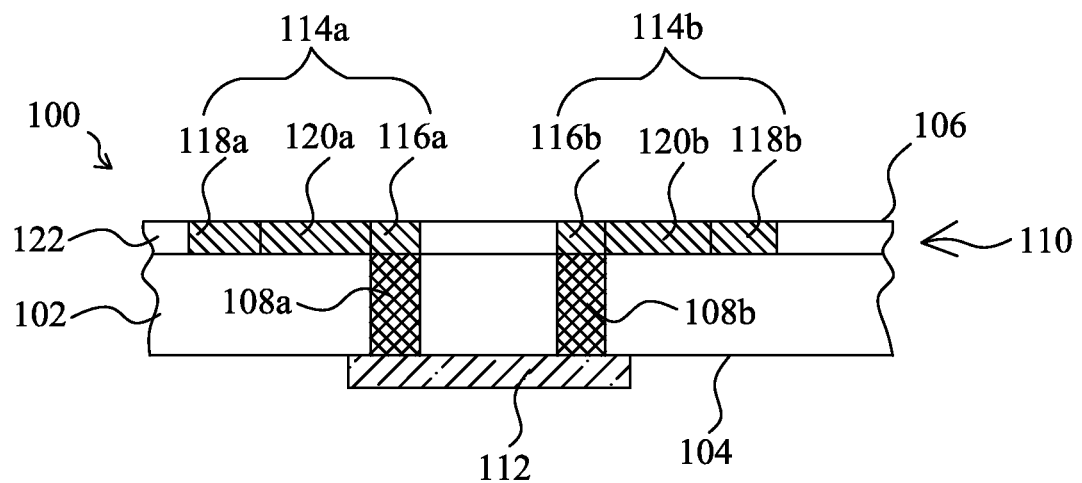
FIG. 1 shows a cross-sectional view of an interposer including a plurality of fuses coupled to a single contact pad in accordance with an embodiment of the present disclosure.

Referring first to FIG. 1, a cross-sectional view of an interposer 100 including a plurality of fuses 120a and 120b in accordance with an embodiment of the present disclosure is shown. The interposer 100 includes a substrate 102, and a contact pad 112 disposed on the substrate 102. A first through-via 108a and a second through-via 108b in the substrate 102 are coupled to the contact pad 112. A first fuse 120a is coupled to the first through-via 108a, and a second fuse 120b is coupled to the second through-via 108. Only one contact 112 is shown in FIG. 1 (and also in FIGS. 3, 6, and 7); however, in accordance with embodiments of the present disclosure, a plurality of contacts 112 may be formed over a surface of the substrate 102. There may be dozens or hundreds of contacts 112, through-vias 108a and 108b, and fuses 120a and 120b formed across the surface of a substrate 102, depending on the application and size of an integrated circuit die 130 (not shown in FIG. 1; see FIG. 4), for example.

Referring again to FIG. 1, to manufacture the interposer 100, the substrate 102 is provided. The substrate 102 may be formed of a semiconductor material, such as silicon, silicon germanium, silicon carbide, gallium arsenide, or other commonly used semiconductor materials. Alternatively, the substrate 102 may be formed of a dielectric material. In some embodiments, the substrate 102 is substantially free from integrated circuit devices, including active devices, such as transistors and diodes. Furthermore, in some embodiments, the substrate 102 may include, or may be free from, passive devices, such as capacitors, resistors, inductors, varactors, and/or the like.

A plurality of through-substrate vias (TSVs) 108a and 108b is formed on the substrate 102. The TSVs 108a and 108b extend entirely through the substrate 102, as shown. The TSVs 108a and 108b are conductive and provide a connection from a first side 104 of the interposer substrate 102 to a second side 106 that is opposite the first side 104. The TSVs comprise a conductive material such as a metal, a semiconductive material such as silicon, or combinations or multiple layers thereof, for example. The TSVs 108a and 108b are also referred to herein as through-vias 108a and 108b.

An interconnect structure 110 is formed over substrate 102 proximate the second side 106 of the substrate 102. The interconnect structure 110 includes one or more insulating material layers 122, and conductive lines 160a, 160b, and 160c and vias 162a, 162b, 162c, 164a, and 164b (not shown in FIG. 1; see FIG. 6, to be described further herein) formed in the insulating material layer(s) 122. The various layers of the interconnect structure 110 may be formed using subtractive etching, direct etching, damascene lithography techniques, and/or combinations thereof, as examples. The interconnect structure 110 may comprise and is also referred to herein as a redistribution layer (RDL), for example. At least some of the through-vias 108a and 108b are electrically coupled to the RDL 110. The RDL 110 may include fan-out regions (not shown) for fanning-out the exterior connections of an integrated circuit die 130 (see FIG. 4) to a larger footprint on the first side 104 of the substrate 102, in some embodiments.

Figure 2:
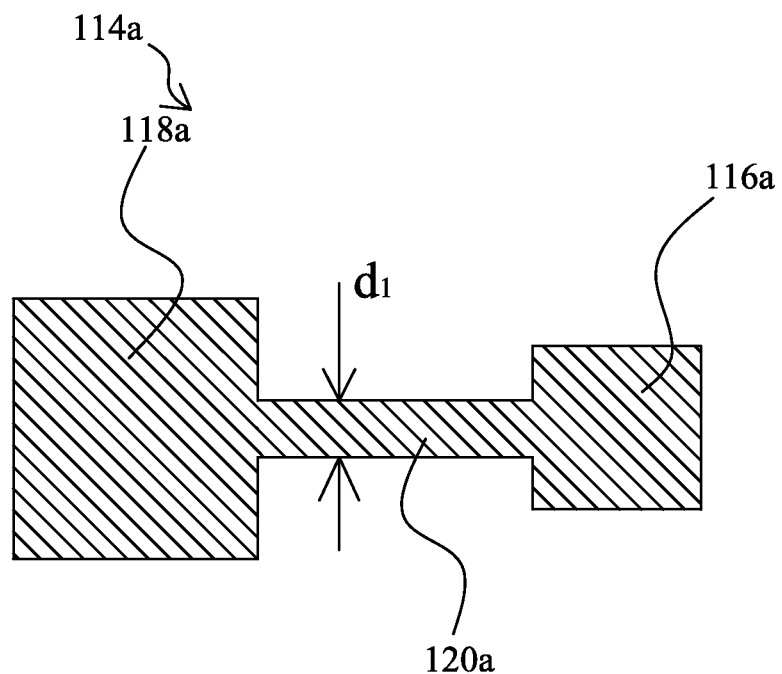
FIG. 2 is a top view of a conductive segment including a fuse of the interposer shown in FIG. 1.

The RDL 110 includes a plurality of fuses 120a and 120b formed therein. The fuses 120a and 120b may be a part of conductive segments 114a and 114b, respectively, as shown in FIG. 1 and also in FIG. 2 in a top view. Conductive segments 114a and 114b may comprise aluminum or an aluminum alloy in some embodiments. Alternatively, conductive segments 114a and 114b may comprise other metals and/or materials suitable for a fuse 120a and 120b material, for example. Conductive segments 114a and 114b each include a connecting region 116a/118a and 116b/118b disposed at each end, respectively. The fuses 120a and 120b are disposed between the connecting regions 116a/118a and 116b/118b of each conductive segment 114a and 114b, respectively. The conductive segments 114a and 114b may be formed in an upper layer or a top layer of the RDL 110, for example, in some embodiments. Alternatively, the conductive segments 114a and 114b may be formed in a lower layer of the RDL 110, in other embodiments, not shown.

The fuses 120a and 120b comprise a dimension $d_1$ comprising a width of about 30 μm in a top view, although alternatively, the fuses 120a and 120b may comprise other dimensions. In some embodiments, dimension $d_1$ may comprise a minimum feature size of the interposer 100, for example. The connecting regions 116a/118a and 116b/118b may comprise a width that is greater than the width $d_1$ of the fuses 120a and 120b. The connecting regions 116a/118a and 116b/118b may be about 3 to 4 times wider than dimension $d_1$ of the width of the fuses 120a and 120b, as an example. Alternatively, the connecting regions 116a/118a and 116b/118b may be larger or smaller than about 3 to 4 times wider than dimension $d_1$, in some embodiments. Connecting regions 116a and 116b may comprise regions for making connection to through-vias 108a and 108b, for example, and thus connecting regions 116a and 116b may comprise a dimension substantially the same as or larger than a width of a through-via 108a and 108b, respectively. Connecting regions 118a and 118b may comprise a region for making electrical connection to an integrated circuit die 130 (see FIG. 4) e.g., by bumps 124a and 124b (see FIG. 3), respectively, in some embodiments. Connecting regions 118a and 118b may comprise bond pads in some embodiments, for example.

Figure 3:
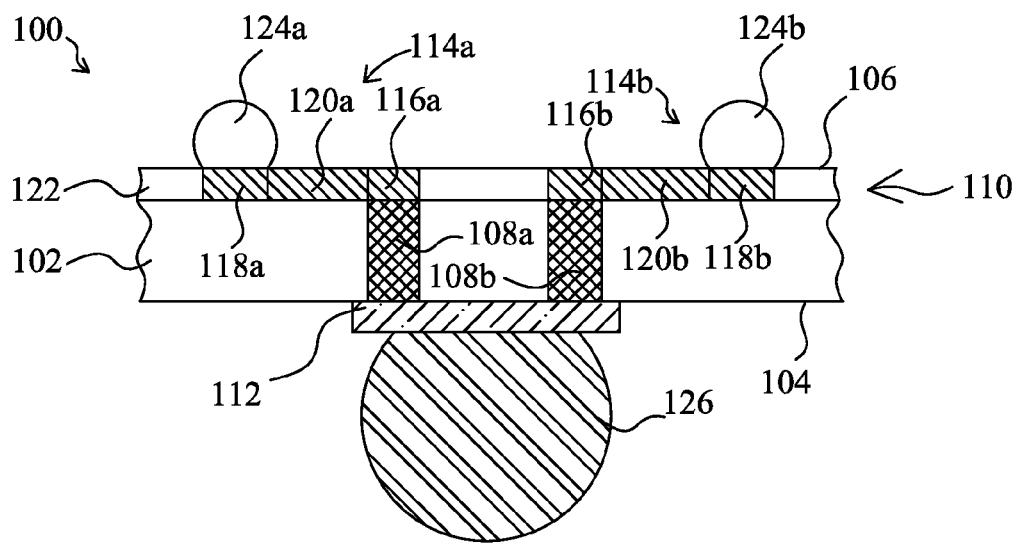
FIG. 3 is a cross-sectional view of the interposer of FIG. 1, including bumps coupled to contact pads and bond pads on the interposer.

A contact pad 112 is disposed on the substrate 100 on the first side 104. The contact pad 112 may be formed using subtractive etching, direct etching, and/or damascene lithography techniques, as examples. The contact pad 112 may comprise a metal adapted to be coupled to a bump 126, as shown in FIG. 3. A first through-via 108a in the substrate 102 is electrically coupled to the contact pad 112. A first fuse 120a is electrically coupled to the first through-via 108a, e.g., by connecting region 116a of the conductive segment 114a. A second through-via 108b in the substrate 102 is electrically coupled to the contact pad 112. A second fuse 120b is electrically coupled to the second through-via 108b, e.g., by connecting region 116b of the conductive segment 114b.

After the formation of the RDL 110 and contact 112, bumps 124a and 124b may be coupled to connecting regions 118a and 118b of the conductive segments 114a and 114b, respectively, and a bump 126 may be formed on contact pad 112, as shown in FIG. 3 in a cross-sectional view. The bumps 124a, 124b, and 126 may comprise solder bumps, such as eutectic solder bumps. Alternatively, bumps 124a, 124b, and 126 may comprise copper bumps or other metal bumps formed of gold, silver, nickel, tungsten, aluminum, other metals, and/or alloys thereof. Bumps 126 may comprise Controlled Collapse Chip Connection (C4) bumps used in semiconductor interconnection techniques such as flip chip, for example. Bumps 126 are larger than bumps 124a and 124b in some embodiments. The bumps 124a and 124b may protrude from the surface of interconnect structure or RDL 110 on the second side 106, and bump 126 may protrude from the substrate 102 on the first side 104, as shown. A solder mask (not shown) may be formed over the first side 104 and/or the second side 106 before the formation of the bumps 124a, 124b, and/or 126 to protect the bump material from forming in undesired regions, for example.

Bumps 124a and 124b may comprise micro-bumps in some embodiments, for example. Each bump 124a and 124b may include an optional metal stud that may comprise copper, a copper alloy, or other metals, and solder formed over the metal stud. The bumps 124a and 124b may alternatively comprise other materials. The metal studs of the bumps 124a and 124b may be formed of any suitable conductive material, including Cu, Ni, Pt, Al, combinations thereof, and may be formed through any number of suitable techniques, including PVD, CVD, electrochemical deposition (ECD), molecular beam epitaxy (MBE), atomic layer deposition (ALD), electroplating, and the like. An optional conductive cap layer may be formed between the metal stud and the solder of the bumps 124a and 124b, also not shown. For example, in an embodiment in which the metal stud is formed of copper, a conductive cap layer formed of nickel may be desirable. Other materials, such as Pt, Au, Ag, combinations thereof, or the like, may also be used for the optional conductive cap layer of the bumps 124a and 124b.

The bumps 124a, 126b, and 126 (and also bumps 126c shown in FIG. 7) may also be referred to herein as a first bump, a second bump, and/or a third bump, depending on the order of introduction in a particular bump 124a, 126b, and 126 section or description, and also in the claims, for example.

The bumps 124a, 126b, and 126 may be formed in a peripheral region of an interposer 100 and may be arranged in one or more rows in the peripheral region. As an example, the bumps 124a, 126b, and 126 may be arranged in three rows on each side of the interposer 100, respectively, along an interposer 100 edge or corners. The bumps 124a, 126b, and 126 may alternatively be arranged in other patterns and may be positioned in other locations. Other embodiments may utilize aspects with bumps 124a, 126b, and 126 along interior portions of an interposer 100, for example. The placement of the bumps 124a, 126b, and 126 are provided for illustrative purposes only and the specific locations and patterns of the bumps 124a, 126b, and 126 on the first side 104 and the second side 106 may vary and may include, as examples, an array of bumps, lines of bumps in a middle region of the interposer 100, or staggered bumps.

Figure 4:
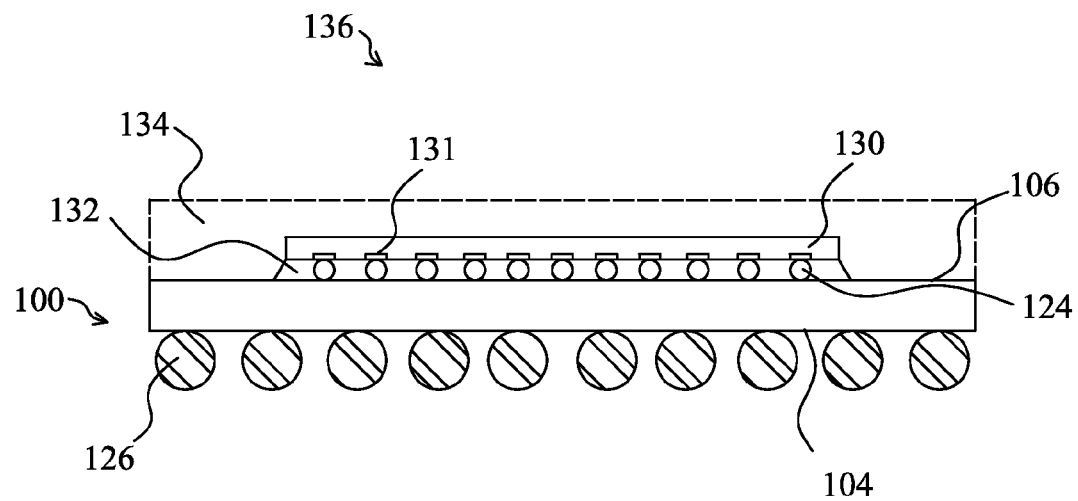
FIG. 4 is a cross-sectional view of packaged semiconductor device including the interposer shown in FIG. 3.

Embodiments of the present disclosure include packaged semiconductor devices that have been packaged using the novel interposers 100 described herein. FIG. 4 is a cross-sectional view of packaged semiconductor device 136 including the interposer 100 shown in FIG. 3. Contacts 131 of the integrated circuit die 130 are electrically coupled to the bumps 124 (which comprise bumps 124a and 124b shown in FIG. 3) of the interposer 100. The die 130 may be placed on the interposer 100 and a solder reflow process may be performed to attach the die 130 to the interposer 100 and make the electrical connections, for example. The solder reflow process reflows the solder of the bumps 124 and electrically couples the die 130 to the interposer 100. Before the solder reflow process, the die 130 may be attached to the interposer 100 using an adhesive, or the solder may also function as a mechanical attachment to the interposer 100. The bumps 124 may be coupled to contacts 131 of the integrated circuit die 130 using a solder process, solder reflow process, and/or thermal compression bonding, as examples. Alternatively, other methods may be used to electrically connect the integrated circuit die 130 to the interposer 100. Note that bumps 126 may be formed after the attachment of the integrated circuit die 130 to the interposer 100 in some embodiments, for example.

An under-fill material 132 may optionally be disposed under the integrated circuit die 130, as shown. The under-fill material 132 may comprise a filler, an epoxy, a hardener, or multiple layers or combinations thereof, as examples, although alternatively, the under-fill material 132 may comprise other materials. The under-fill material 132 may comprise a material with a viscosity sufficient to flow at least partially, and in some embodiments, to flow completely beneath the integrated circuit die 130, for example.

An optional molding compound 134, shown in phantom in FIG. 4, may optionally be disposed over the integrated circuit die 130 and the interposer 100. The molding compound 134 may comprise an epoxy, a filler, an organic material, or multiple layers or combinations thereof, for example, although the molding compound 134 may also comprise other materials. The molding compound 134 may extend above a top surface of the integrated circuit die 130 by about 10 μm or greater, for example. If the integrated circuit die 130 is large, a greater amount of molding compound 134 may be used, to provide more robustness for the package, in some embodiments.

The packaged semiconductor devices 136 are singulated, at scribe lines or singulation lines, and the packaged semiconductor devices 136 are separated from one another. The packaged semiconductor devices 136 may then be connected to external circuitry (not shown) using bumps 126. The bumps 126 may be coupled to a substrate, a printed circuit board (PCB), another integrated circuit die, or other applications, as examples, not shown. As one example, the packaged semiconductor device 136 may be placed onto an organic substrate or other external circuitry having a matching pad layout to the bumps 126, and the solder of the bumps 126 may be reflowed, completing the interconnect.

Figure 5:
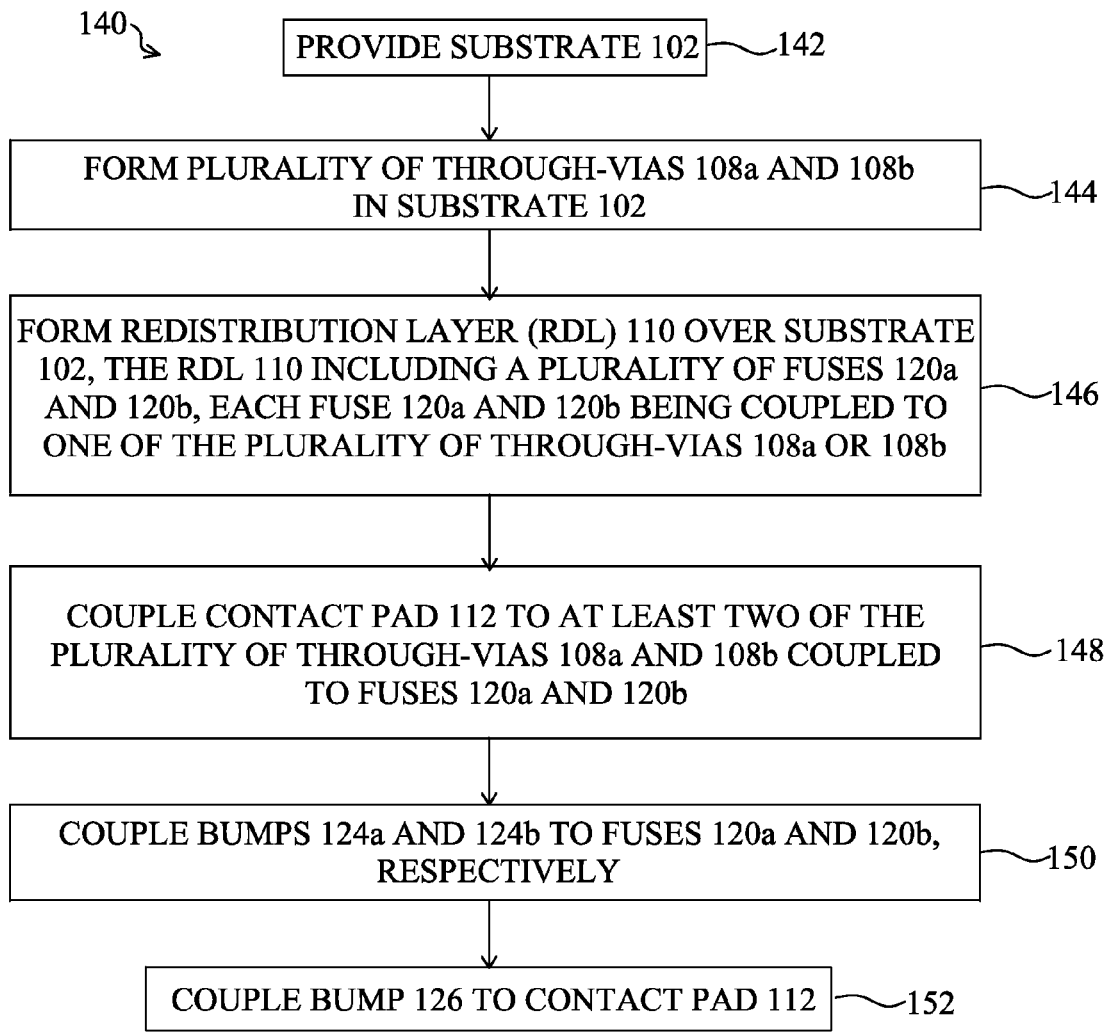
FIG. 5 is a flow chart illustrating a method of manufacturing an interposer in accordance with an embodiment.

Embodiments of the present disclosure also include methods of forming the interposers 100. For example, FIG. 5 is a flow chart 140 illustrating a method of manufacturing an interposer 100 in accordance with an embodiment. The method includes providing a substrate 102 (step 142), and forming a plurality of through-vias 108a and 108b in the substrate 102 (step 144). A redistribution layer (RDL) 110 is formed over the substrate 102 (step 146), the RDL 110 including a plurality of fuses 120a and 120b formed therein, each fuse 120a and 120b being coupled to one of the plurality of through-vias 108a and 108b. The method includes coupling a contact pad 112 to at least two of the plurality of through-vias 108a and 108b coupled to the fuses 120a and 120b (step 148). A first bump 126 is coupled to the contact pad 126 (step 152), and a second bump 124a and 124b is coupled to each of the plurality of fuses 120a and 120b (step 150). Note that the order of steps 146 and 148, and steps 150 and 152, of the flow chart 140 need not necessarily be performed in any order or in the order shown in the flow chart 140 in some embodiments.

Figure 6:
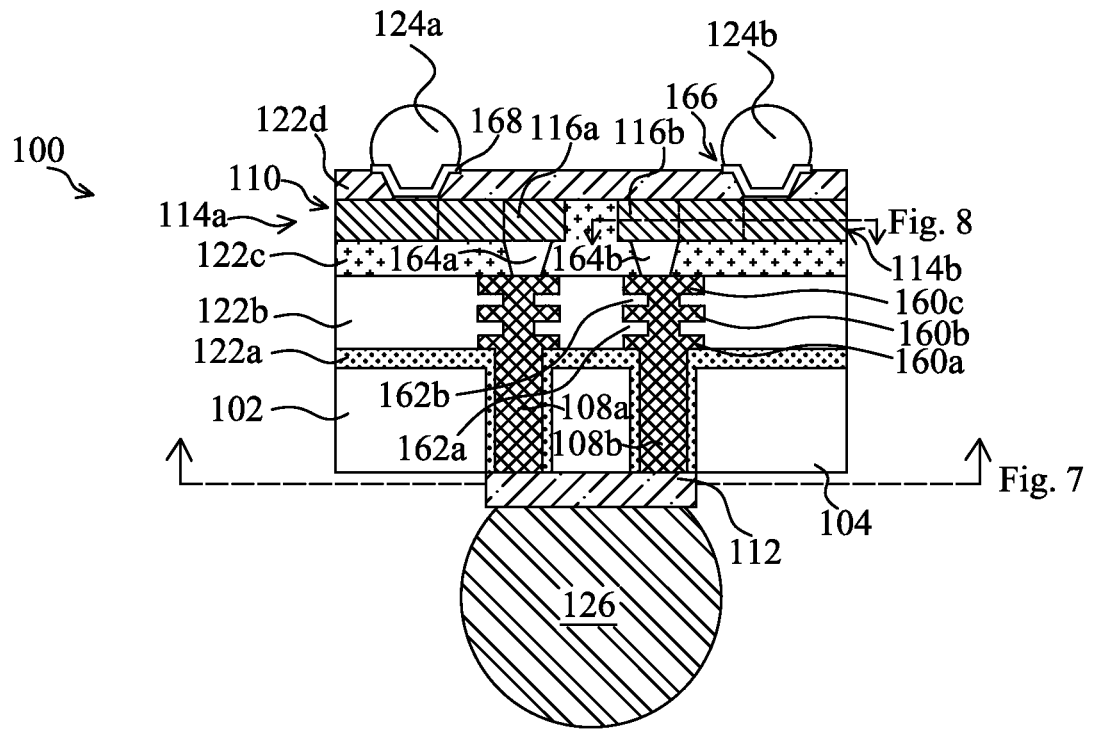
FIG. 6 shows a cross-sectional view of an interposer in accordance with an another embodiment of the present disclosure.

The methods of forming the interposers 100 in accordance with an embodiment may optionally also include coupling each fuse 120a and 120b to one of the plurality of through-vias 108a and 108b using at least one conductive line 160a, 160b, and 160c, at least one via 162a, 162b, 164a, and 164b, or a combination thereof disposed in the substrate 102, to be described further herein with reference to FIG. 6.

Additional material layers may also be formed over the substrate 102 of the interposer 100 in accordance with other embodiments. For example, FIG. 6 shows a cross-sectional view of an interposer 100 in accordance with another embodiment of the present disclosure that includes a plurality of optional additional material layers. Like numerals are used to describe the various elements, and to avoid repetition, each element is not described again herein.

An insulating material layer 122a is formed over the substrate 100 before holes are filled in the substrate 100 to form the through-vias 108a and 108b. Insulating material layer 122b includes a plurality of conductive lines 160a, 160b, and 160c with vias 162a and 162b disposed between each conductive line 160a, 160b, and 160c layer coupled to the conductive lines 160a, 160b, and 160c.

Conductive lines 160a may be formed in an M1 metallization layer, vias 162a may be formed in a V1 metallization layer, conductive lines 160b may be formed in an M2 metallization layer, vias 162b may be formed in a V2 metallization layer, and conductive lines 160c may be formed in an M3 metallization layer, for example. Alternatively, the conductive lines 160a, 160b, and 160c and vias 162a and 162b may be formed in other metallization layers of the interposer 100. Vias 164a and 164b are formed beneath connecting regions 116a and 116b of the conductive segments 114a and 114b, respectively, within insulating material layer 122c. An under-ball metallization (UBM) structure 166 may be formed over the conductive segments 114a and 114b and insulating material layer 122c. The UBM 166 includes conductive lines 168 comprising a metal formed within and over portions of insulating material layer 122d. The UBM 166 is optional and facilitates the formation of the bumps 124a and 124b.

The insulating material layers 122a, 122b, 122c, and 122d may comprise silicon dioxide, undoped silicon glass (USG) oxide, or other insulators, and the conductive lines 160a, 160b, 160c, and 168 and vias 162a, and 162b may comprise copper, copper alloys, or other conductors, as examples. Vias 164a and 164b and conductive segments 114a and 114b may comprise aluminum, an aluminum alloy, or other metals, as examples. Optional etch stop layers, not shown, may be formed between each insulating material layer 122a, 122b, 122c, and 122d. The etch stop layers may comprise SiC, SiN, or other insulating materials.

Figure 7:
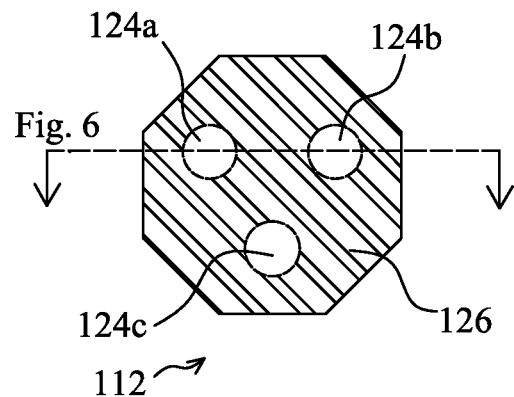
FIG. 7 is a bottom view of a portion of the interposer shown in FIG. 6.
Figure 13:
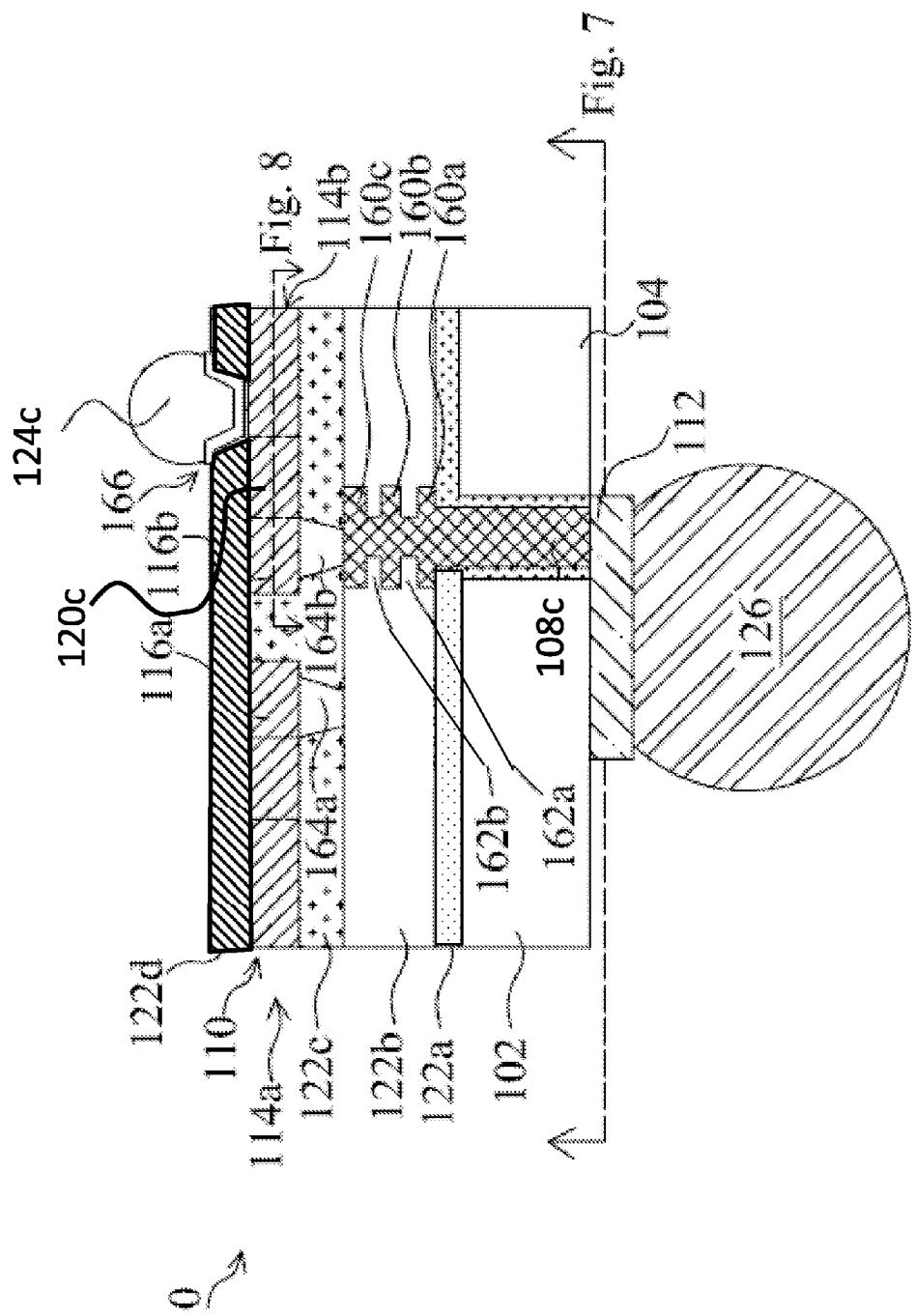
FIG. 13 illustrates a third fuse and third through-via in cross-sectional view.

FIG. 7 is a bottom view of a portion of the interposer 100 shown in FIG. 6. A third bump 124c formed elsewhere on the interposer 100 is visible in phantom above the bump 126 formed on the contact pad 112. The third bump 124c is also coupled to a third fuse that is part of a third conductive segment, not shown in FIG. 6. FIG. 13 illustrates in cross-sectional view a third bump 124c coupled to a third fuse 1220c by way of a third through-via 108c. Likewise, greater than three bumps and fuses may be electrically coupled above the bump 126, e.g., four or more bumps 126 and fuses 120, using additional through-vias 108, conductive lines 160 and 168, and vias 162 and 164 in accordance with embodiments, not shown in the drawings. The through-vias 108 may be disposed directly under the bumps 126 or disposed proximate the bumps 126, and the fuses 120 and conductive segments 114 may be spread out away from the bumps 126 in the layout, for example. FIG. 7 also illustrates a possible shape of the contact pad 112 for the bumps 126 in a bottom view. The shape of the contact pad 112 may be trapezoidal, square, rectangular, circular, or other shapes, as examples.

Note that the plurality of bumps 124a, 124b, and 124c described herein may be coupled to different electrical connections of an integrated circuit die 130, or alternatively, the plurality of bumps 124a, 124b, and 124c may be coupled to the same electrical connection of the integrated circuit die 130, providing redundant connections for a single bump 126, in accordance with some embodiments.

Figure 8:
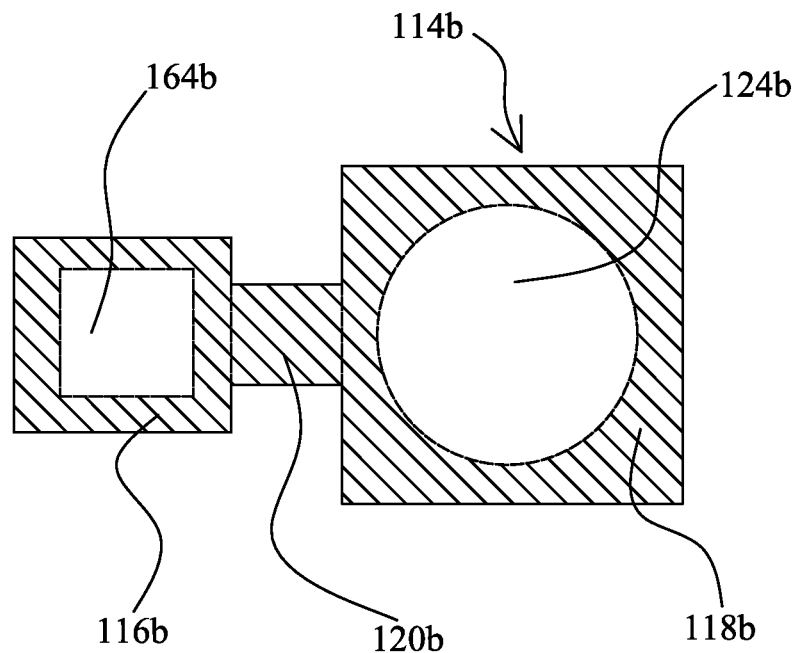
FIG. 8 is a top view of a portion of the interposer shown in FIG. 6.

FIG. 8 is a top view of a portion of the interposer 100 shown in FIG. 6, illustrating a conductive segment 114b. A via 164b disposed beneath the conductive segment 114b and a bump 124b disposed above the conductive segment 114b are shown in phantom in FIG. 8.

Figure 9:
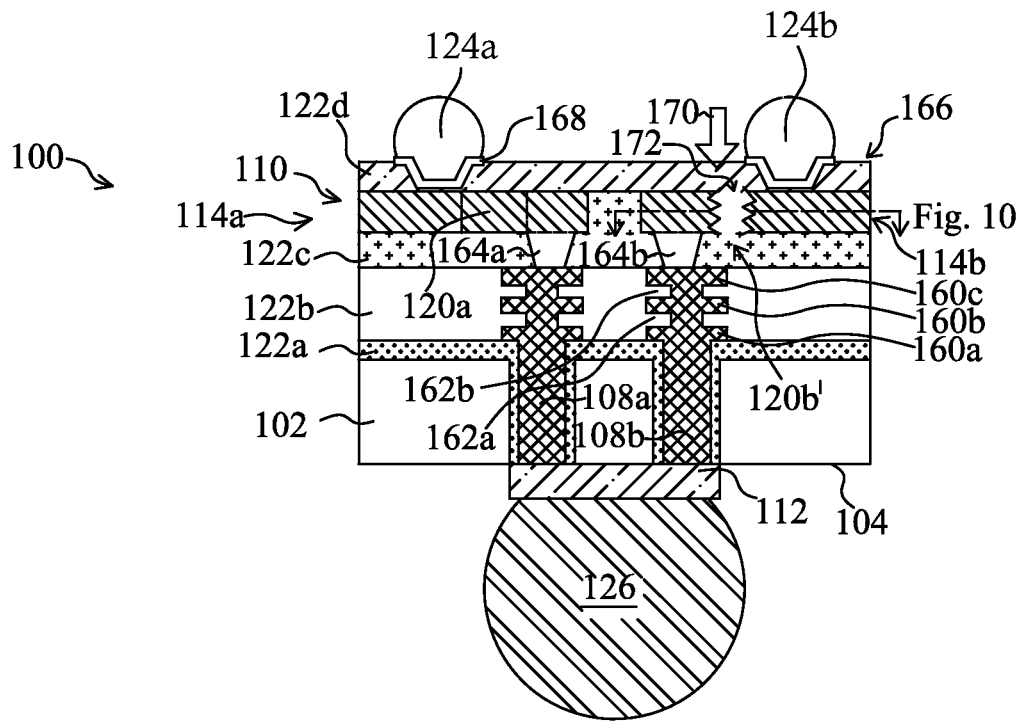
FIG. 9 shows a cross-sectional view of the interposer shown in FIG. 6 after a laser has been used to program one of the fuses.

Referring next to FIG. 9, during normal operation of a packaged semiconductor device 136, current may be applied through the interposer 100 by applying a voltage across bump 126 and bumps 124a, 124b, and/or 124c. As an example for bump 124a, the current flows from bump 124a through conductive segment 114a including fuse 120a, through-via 164a, conductive line 160c, via 162b, conductive line 160b, via 162a, and conductive line 160a, then through through-via 108a, through contact pad 112, to bump 126. A fuse 120a, 120b, or 120c of embodiments of the present disclosure is programmed or "blown" by applying a laser beam, laser energy, laser pulse, or other form of high energy directly towards the intended fuse 120a, 120b, or 120c.

Figure 10:
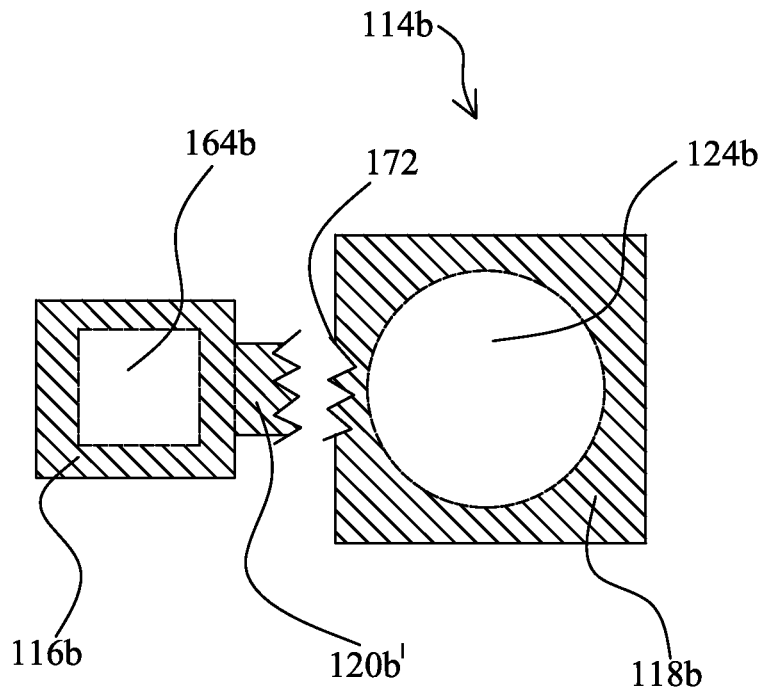
FIG. 10 is a top view of a conductive segment including the programmed fuse shown in FIG. 9.
Figure 11:
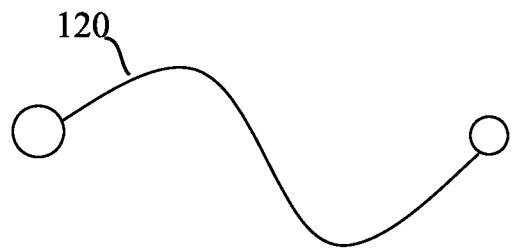
FIGS. 11 and 12 show schematic representations of fuses of embodiments of the present disclosure, before and after programming, respectively.
Figure 12:
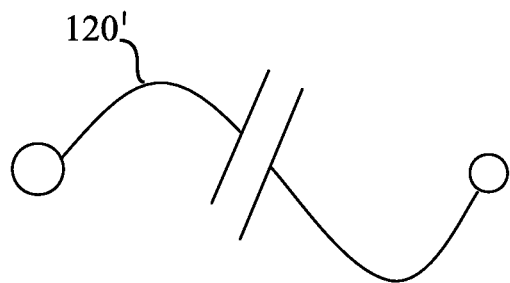

For example, FIG. 9 shows a cross-sectional view of the interposer 100 shown in FIG. 6 after a laser has been used to program one of the fuses 120b'. The laser energy 170 directed towards the fuse 120b' causes a break 172 in the thin fuse 120b' and prohibits current flow from the associated bump 124b to bump 126. FIG. 10 is a top view of a conductive segment 114b including the programmed fuse 120b' shown in FIG. 9. FIGS. 11 and 12 show schematic representations of fuses 120 and 120' of embodiments of the present disclosure, before programming at 120, and after programming at 120', respectively.

Embodiments of the present disclosure include interposers 100, methods of forming the interposers 100 described herein, and also packaged semiconductor devices 136 including the interposers 100.

Advantages of embodiments of the disclosure include providing novel interposers 100. The fuses 120a, 120b, and 120c are easily implementable in manufacturing process flows for the interposers 100. The fuses 120a, 120b, or 120c may be blown or programmed either before, or after, packaging a semiconductor device. The fuses 120a, 120b, or 120c are easily programmable using a laser or other high energy pulse, for example. The fuses 120a, 120b, and 120c are multi-purpose and provide multiple current paths for the interposers 100.

The ability to blow the fuses 120a, 120b, or 120c allows an increase in the manufacturing yields and packaging yields for the interposers 100 quickly and effectively without additional costs. Non-functioning or unwanted portions of the interposer 100 and/or the integrated circuit die 130 packaged using the interposer 100 may be disconnected by programming or blowing the fuses 120a, 120b, or 120c. The fuses 120a,120b, or 120c may be programmed and used for circuit repair to replace failing or failed circuits with spare, redundant circuits or wiring that are formed elsewhere over the substrate 102 or on the die 130, not shown in the drawings. The fuses 120a, 120b, or 120c may also be programmed to increase the number of usable portions of the interposers 100, as examples. Advantageously, only one of the plurality of fuses 120a, 120b, or 120c, two or more fuses 120a, 120b, or 120c, or all of the fuses 120a, 120b, or 120c coupled to the bump 126 by through-vias 108a, 108b, and/or 108c, respectively, may be programmed or blown, allowing a great deal of flexibility to IC designers and end users.

The interposers 100 described herein may be used to package 3DICs and other types of semiconductor packages. The interposers 100 may be used for through-interposer stacking (TIS) and may advantageously utilize bumps 126 comprising C4 bumps and bumps 124a, 124b, and 124c comprising micro-bumps in some embodiments, as other examples. Multiple through-vias 108a, 108b, and 108c and fuses 120a, 120b, and 120c may be coupled to single bumps 126 in particular targeted weak areas of a design in order to resolve packaging yield issues, in some applications.

In accordance with one embodiment of the present disclosure, an interposer includes a substrate, a contact pad disposed on the substrate, and a first through-via in the substrate coupled to the contact pad. A first fuse is coupled to the first through-via. A second through-via in the substrate is coupled to the contact pad, and a second fuse is coupled to the second through-via.

In accordance with another embodiment, an interposer for packaging a semiconductor device includes a substrate comprising a first side and a second side opposite the first side. A plurality of through-vias is disposed in the substrate proximate the first side, and an interconnect structure is disposed in the substrate proximate the second side. The interconnect structure includes a plurality of fuses. A contact pad is coupled to at least two of the plurality of through-vias proximate the first side. Each of the at least two of the plurality of through-vias is coupled to one of the plurality of fuses, and a bump is coupled to the contact pad.

In accordance with yet another embodiment, a method of manufacturing an interposer for packaging a semiconductor device includes providing a substrate, and forming a plurality of through-vias in the substrate. A redistribution layer (RDL) is formed over the substrate, the RDL including a plurality of fuses formed therein, each fuse being coupled to one of the plurality of through-vias. The method includes coupling a contact pad to at least two of the plurality of through-vias coupled to the fuses. A first bump is coupled to the contact pad, and a second bump is coupled to each of the plurality of fuses.

Although embodiments of the present disclosure and their advantages have been described in detail, it should be understood that various changes, substitutions and alterations can be made herein without departing from the spirit and scope of the disclosure as defined by the appended claims. For example, it will be readily understood by those skilled in the art that many of the features, functions, processes, and materials described herein may be varied while remaining within the scope of the present disclosure. Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. An interposer, comprising:
   a substrate;
   a contact pad disposed on a first side of the substrate;
   a first through-via in the substrate having a first end terminating on and directly contacting the contact pad;
   a first fuse on a second side of the substrate opposite the first side and coupled to the first through-via;
   a second through-via in the substrate having a first end terminating on and directly contacting the contact pad; and
   a second fuse on the second side of the substrate and coupled to the second through-via;
   the first fuse is connected between a first connecting region and a second connecting region, and the first connecting region, the second connecting region and the first fuse are embedded in an insulating material layer on the substrate wherein a width of the first connecting region, the second connecting region and the first fuse is different from each other in a planar view; and
   the second fuse is connected between a third connecting portion and a fourth connecting portion, and the third connecting portion, the fourth connecting portion and the second fuse are embedded in the insulating material layer on the substrate wherein a width of the third connecting portion, the fourth connecting portion and the second fuse is different from each other in the planar view.

2. The interposer according to claim 1, wherein the first fuse and the second fuse are disposed in a redistribution layer (RDL).

3. The interposer according to claim 1, further comprising at least one third through-via having a first end terminating on the contact pad, and at least one third fuse on the second side of the substrate, wherein each at least one third fuse is coupled to one of the at least one third through-vias.

4. The interposer according to claim 1, further comprising a first bond pad on the second side of the substrate coupled to the first fuse and a second bond pad on the second side of the substrate coupled to the second fuse.

5. The interposer according to claim 4, further comprising a first bump coupled to the first bond pad and a second bump coupled to the second bond pad.

6. The interposer according to claim 5, further comprising a third bump coupled to the contact pad.

7. The interposer according to claim 6, wherein the third bump is larger than the first bump and the second bump.

8. The interposer according to claim 6, wherein the first bump, the second bump, or the third bump comprise solder.

9. An interposer for packaging a semiconductor device, comprising:
   a substrate comprising a first side and a second side opposite the first side;
   a plurality of through-vias disposed in the substrate proximate the first side;
   an interconnect structure disposed in the substrate proximate the second side, the interconnect structure including a plurality of fuses;
   a contact pad proximate the first side, wherein at least two of the plurality of through-vias land on and directly contact the contact pad, each of the at least two of the plurality of through-vias being coupled to a respective one of the plurality of fuses;
   a bump coupled to the contact pad;
   a first fuse of the plurality of fuses is connected between a first connecting region and a second connecting region, and the first connecting region, the second connecting region and the first fuse are embedded in an insulating material layer in the interconnect structure wherein a width of the first connecting region, the second connecting region and the first fuse is different from each other in a planar view; and
   a second fuse of the plurality of fuses is connected between a third connecting region and a fourth connecting region, and the third connecting region, the fourth connecting region and the second fuse are embedded in the insulating material layer in the interconnect structure wherein a width of the third connecting region, the fourth connecting region and the second fuse is different from each other in the planar view.

10. The interposer according to claim 9, wherein the substrate is substantially free of integrated circuit devices.

11. The interposer according to claim 9, wherein the interposer comprises a three dimensional integrated circuit (3DIC) interposer.

12. The interposer according to claim 9, wherein the plurality of fuses is programmable using a laser, before or after an integrated circuit is packaged using the interposer.

13. The interposer according to claim 9, wherein the bump comprises a first bump, further comprising an under-ball metallization (UBM) structure coupled to the interconnect structure and a plurality of second bumps coupled to the UBM structure, and wherein portions of the UBM structure are coupled to the plurality of fuses coupled to the at least two of the plurality of through-vias.

14. The interposer according to claim 13, wherein the plurality of second bumps is coupleable to an integrated circuit die.

15. The interposer according to claim 13, wherein the first bump is coupleable to a substrate, a printed circuit board (PCB), or an integrated circuit die.

16. A semiconductor device packaged using the interposer according to claim 13, wherein a plurality of contacts of an integrated circuit die is electrically coupled to the plurality of second bumps.

17. The packaged semiconductor device according to claim 16, further comprising an under-fill material disposed under the integrated circuit die.

18. The packaged semiconductor device according to claim 16, further comprising a molding compound disposed over the integrated circuit die and the interposer.

19. A method of manufacturing an interposer for packaging a semiconductor device, the method comprising:
   providing a substrate;
   forming a plurality of through-vias in the substrate;
   forming a redistribution layer (RDL) over the substrate, the RDL including a plurality of fuses formed therein, each fuse being coupled to one of the plurality of through-vias and each fuse being formed proximate a first surface of the substrate;
   forming a contact pad proximate a second surface of the substrate opposite the first surface of the substrate, the contact pad being formed and directly on at least two of the plurality of through-vias coupled to the fuses;
   coupling a first bump to the contact pad;
   coupling a respective second bump to each of the plurality of fuses;
   a first fuse of the plurality of fuses is connected between a first connecting region and a second connecting region, and the first connecting region, the second connecting region and the first fuse are embedded in an insulating material layer in the RDL wherein a width of the first connecting region, the second connecting region and the first fuse is different from each other in a planar view; and a second fuse of the plurality of fuses is connected between a third connecting region and a fourth connecting region, and the third connecting region, the fourth connecting region and the second fuse are embedded in the insulating material layer in the RDL wherein a width of the third connecting region, the fourth connecting region and the second fuse is different from each other in the planar view.

20. The method according to claim 19, further comprising coupling each fuse to one of the plurality of through-vias using at least one conductive line, at least one via, or a combination thereof disposed in the substrate.

\* \* \* \* \*